(12) United States Patent
Kang et al.

(10) Patent No.: US 7,598,564 B2
(45) Date of Patent: Oct. 6, 2009

(54) NON-VOLATILE MEMORY DEVICES AND METHODS OF FORMING NON-VOLATILE MEMORY DEVICES

(75) Inventors: Dae-woong Kang, Seoul (KR); Sung-nam Chang, Seoul (KR); Kwang-jae Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 198 days.

(21) Appl. No.: 11/443,449

(22) Filed: May 31, 2006

(65) Prior Publication Data

US 2007/0034938 A1 Feb. 15, 2007

(30) Foreign Application Priority Data

May 31, 2005 (KR) ............... 10-2005-0046361

(51) Int. Cl.
*H01L 29/788* (2006.01)
(52) U.S. Cl. .............. 257/316; 257/315; 257/E29.129; 257/E29.3; 438/257; 438/211
(58) Field of Classification Search ............. 257/316, 257/315, E29.29, E29.3; 438/257, 211
See application file for complete search history.

(56) References Cited

U.S. PATENT DOCUMENTS 5,998,290 A * 12/1999 Wu et al. ............... 438/595
6,288,419 B1 * 9/2001 Prall et al. ............... 257/213
6,342,681 B1   1/2002 Goldberger et al.
6,346,467 B1   2/2002 Chang et al.
6,720,579 B2   4/2004 Shin et al.
2004/0178456 A1 * 9/2004 Park et al. ............... 257/390

FOREIGN PATENT DOCUMENTS

| JP | 2003-531472 | 10/2003 |
|---|---|---|
| KR | 2002-0029772 | 4/2002 |
| KR | 10-2002-0060490 A | 7/2002 |
| KR | 2003-0002111 | 1/2003 |
| KR | 2003-0059439 | 7/2003 |
| KR | 10-2004-0013189 A | 2/2004 |

* cited by examiner

*Primary Examiner*—Kiesha L Rose
*Assistant Examiner*—Tucker Wright
(74) *Attorney, Agent, or Firm*—Lee & Morse, P.C.

(57) ABSTRACT

A non-volatile memory device including a barrier spacer that serves to protect a control gate, including a metal layer, from damage that may result from exposure to a cleaning solution and/or oxygen. With the barrier spacer layer, a cleaning process using a high-power cleaning solution may be used to effectively remove etch byproducts. An oxidation process may be performed to cure etch damage of an intergate dielectric pattern, a floating gate and a gate insulator. The barrier spacer and/or the oxidation process enable a non-volatile memory device having enhanced speed and reliability to be formed.

7 Claims, 11 Drawing Sheets

NON-VOLATILE MEMORY DEVICES AND METHODS OF FORMING NON-VOLATILE MEMORY DEVICES

BACKGROUND OF THE INVENTION

1. Field of the Invention

The present invention relates to semiconductor devices and methods of forming the semiconductor devices. More particularly, the present invention relates to non-volatile memory devices and methods of forming the non-volatile memory devices.

2. Description of the Related Art

Non-volatile memory devices, such as flash memory devices, generally include a cell array region and a peripheral circuit region for driving the cell array region. In the cell array region, programming and erasing of the cells may be performed using Fowler-Nordheim (FN) tunneling. More particularly, programming is performed by injecting electrons into a floating gate and erasing is performed by ejecting electrons from the floating gate using FN tunneling. A cell transistor in the cell array region includes a gate insulator, a floating gate, an intergate dielectric and a control gate sequentially stacked in the order named. To enhance an operating speed of a semiconductor device, control gates are made of metallic substance, e.g., tungsten silicide. However, with the continuous trend toward higher integration and higher densities of semiconductor devices, line-widths are trending below a nanometer in width. Thus, electrical sheet resistances of the conventional silicon silicide are increasing, causing increases in RC signal delays relative to distance and deterioration of cell threshold voltage distribution.

Different approaches for overcoming the foregoing problems have been proposed. One of the approaches proposed forming a control gate from a metal having a low sheet resistance, for example, tungsten. Tungsten is, however, easily corroded by a mixture of ammonium hydroxide, hydrogen peroxide and de-ionized water (DI water), which is used to remove etch byproducts. In the following description, such mixtures of ammonium hydroxide, hydrogen peroxide and DI water will be referred to as "SC1". Accordingly, there is a need for solutions for removing etch byproducts that do not corrode such metals, e.g., tungsten. Known solutions with a lower detergency than SC1 are incapable of fully removing etch byproducts. Moreover, during an oxidation process for curing etch damage of a gate, the tungsten of a control gate is oxidized, thereby forming an unwanted body. Due to the unwanted body, a bridge may be formed, thereby degrading a reliability of a semiconductor device.

Many attempts have been made to prevent such degradation in the reliability of semiconductor devices. One proposed approach for suppressing the oxidation of tungsten has been to significantly reduce a ratio of oxygen during an oxidation process for curing the etch damage of a floating gate. But such an approach suffers from a much lower curability of the floating gate than a conventional gate re-oxidation process. Therefore, the reliability of semiconductor devices having gates cured by such a reduced-oxygen-ratio-oxidation process is still degraded.

SUMMARY OF THE INVENTION

The invention is therefore directed to non-volatile memory devices and methods of forming non-volatile memory devices, which substantially overcome one or more of the problems due to the limitations and disadvantages of the related art It is therefore a feature of embodiments of the invention to provide non-volatile memory devices including a barrier spacer that serves to protect a control gate, including a metal layer, from damage that may result from exposure to a cleaning solution and/or oxygen. With the barrier spacer layer, a cleaning process using a high-power cleaning solution may be used to effectively remove etch byproducts during formation of the non-volatile memory device. During formation of the non-volatile memory device, an oxidation process may be performed to cure etch damage of, e.g., an intergate dielectric pattern, a floating gate and a gate insulator. The barrier spacer and/or the oxidation process enable non-volatile memory devices having enhanced speed and reliability to be formed.

At least one of the above and other features and advantages of the invention may be realized by providing a non-volatile memory device, including field oxides disposed in a semiconductor substrate to define active regions, a string selection line crossing over the active regions, a ground selection line crossing over the active regions, a plurality of wordlines crossing over the active regions, each of the string selection line and the ground selection line including a first gate insulator formed on one of the active regions, a first floating gate, the first floating gate being formed on the first gate insulator and including a first sidewall and a second sidewall, a first intergate dielectric pattern formed on the first floating gate, a first control gate formed on the first intergate dielectric pattern and on the first floating gate and being in contact with the first floating gate and the first intergate dielectric pattern, and a first mask pattern formed on the first control gate each of the wordlines including a second gate insulator formed on one of the active regions, a second floating gate, the second floating gate being formed on the second gate insulator and including a first sidewall and a second sidewall, a second intergate dielectric pattern formed on the second floating gate, a second control gate formed on the second intergate dielectric pattern, and a second mask pattern formed on the second control gate, a thermal oxide layer covering the first sidewall and the second sidewall of the second floating gate and the second sidewall of the first floating gate, first barrier spacers, each of the first barrier spacers covering a combination of a first sidewall of the first mask patterns, a first sidewall of the first control gates and the first sidewall of the first floating gates defining a same side of the of the respective string or ground selection line, and second barrier spacers, each of the second barrier spacers covering one of a combination of a second sidewall of the first mask pattern and a second sidewall of the first control gate, a combination of a first sidewall of the second mask pattern and a first sidewall of the second control gate, and a combination of a second sidewall of the second mask pattern and a second sidewall of the second control gate.

Each of the first and second barrier spacers may include a medium-temperature oxide (MTO) layer and a silicon nitride layer. The MTO layer may be a substantially L-shaped layer. Each of the first and second intergate dielectric patterns may include a first oxide layer, a nitride layer and a second oxide layer, which are sequentially stacked. At least one end of at least one of a boundary between the first oxide layer and the nitride layer, a boundary between the second oxide layer and the nitride layer, a boundary between the first floating gate and the first gate insulator, and a boundary between the second floating gate and the second gate insulator may be curved. The first control gates and the second control gates may each include a metal layer. The metal layer may include tungsten. The first floating gates and the second floating gates may be made of polysilicon doped with N-type impurities, and the first control gates and the second control gates may further include a polysilicon layer doped with N-type impurities, the polysilicon layer being arranged below the metal layer.

The non-volatile memory device may further include spacers covering the first barrier spacers and the second barrier spacers, lightly doped regions formed in the semiconductor substrate below the spacers, heavily doped regions formed in the semiconductor substrate adjacent to the spacers and between the respective ones of the ground selection lines and the string selection lines, an interlayer dielectric covering the string selection lines, the ground selection lines and the wordlines, a common source line arranged between adjacent ones of the ground selection lines and contacting one of the heavily doped regions through the interlayer dielectric, and a bitline contact arranged between adjacent ones of the string selection lines and contacting another one of the heavily doped regions through the interlayer dielectric.

At least one of the above and other features and advantages of the present invention may be separately realized by providing a method of forming a non-volatile memory device including sequentially forming a gate insulator, a floating gate layer, and an intergate dielectric on a semiconductor substrate, patterning the intergate dielectric to form a temporary intergate dielectric pattern having a width along a first direction and exposing a portion of the floating gate layer, forming a control gate layer and a mask layer on the semiconductor substrate, successively patterning the mask layer, the control gate layer, and the floating gate layer, to form a floating gate pattern having a width along the first direction that is greater than the width of the temporary intergate dielectric pattern and exposing portions of the floating gate pattern, a first control gate and a first mask pattern sequentially stacked and covering an edge of the temporary intergate dielectric pattern and one of the exposed portions of the floating gate pattern, and a second control gate and a second mask pattern sequentially stacked on the first intergate dielectric pattern, forming a barrier layer and patterning the barrier layer to form first barrier spacers, each covering a combination of one of a first sidewall and a second sidewall of the floating gate pattern, a first sidewall of the first control gate and a first sidewall of the first mask pattern, and second barrier spacers, each covering one of a combination of a second sidewall of the first control gate and a second sidewall of the first mask pattern, a combination of a first sidewall of the second control gate and a first sidewall of the second mask pattern, and a combination of a second sidewall of the second control gate and a second sidewall of the second mask pattern, etching the temporary intergate dielectric pattern, using the first and second mask patterns and the first and second barrier spacers as etch masks, to expose a top surface of the floating gate pattern and form a first intergate dielectric pattern and a second intergate dielectric pattern below the first control gate and the second control gate, respectively, performing a first oxidation process to form a first oxide layer on the floating gate pattern, patterning the first oxide layer and the floating gate pattern, using the first and second mask patterns and the first and second barrier spacers as etch masks, to expose the gate insulator and form a first floating gate and a second floating gate below the first control gate and the second control gate, respectively, and performing a second oxidation process to form a second oxide layer on opposite sidewalls of the second floating gate and a sidewall of the first floating gate exposed by the patterning of the floating gate pattern, wherein the first floating gate, the first intergate dielectric pattern, the first control gate, the first mask pattern, and the first barrier spacer constitute one of a string selection line and a ground selection line, and wherein the second floating gate, the second intergate dielectric pattern, the second control gate, the second mask pattern, and the second barrier spacer constitute a plurality of wordlines running between the string selection line and the ground selection line.

The method of forming a non-volatile memory device may include, before forming the first and second barrier spacers, performing a cleaning process using a non-oxidative cleaning solution. The non-oxidative cleaning solution may include a weak acidic mixture of ammonium hydroxide, hydrofluoric acid (HF), and acetic acid. The method of forming a non-volatile memory device may include, before performing the second oxidation process, performing a cleaning process using an oxidative cleaning solution.

The oxidative cleaning solution may include a mixture of ammonium hydroxide, hydrogen peroxide, and deionized water (DI water). Forming the first barrier spacer and the second barrier spacer may include stacking a medium-temperature oxide (MTO) layer and a silicon nitride layer, the silicon nitride layer have a shape that substantially corresponds to a shape of the MTO layer; and anisotropically etching the silicon nitride layer and the MTO layer. The control gate layer may include a metal layer. The metal layer may include tungsten. The floating gate layer may be made of polysilicon doped with N-type impurities, and the control gate layer may include a polysilicon layer doped with N-type impurities.

The intergate dielectric may include a first oxide layer, a nitride layer and a second oxide layer, which are sequentially stacked. The method of forming a non-volatile memory device may include, after performing the second oxidation process, forming a lightly doped regions in the semiconductor substrate adjacent to the first and second floating gates, forming spacers to cover the first barrier spacers and the second barrier spacers and the lightly doped regions, forming heavily doped regions in the semiconductor substrate adjacent to the spacers and between respective ones of the ground selection lines and the string selection lines, forming an interlayer dielectric to cover the respective ground selection lines, the string selection lines and the wordlines, forming a common source line between adjacent ones of the ground selection lines and in contact with one of the heavily doped regions, and forming a bitline contact between adjacent ones of the string selection lines and in contact with the one of the heavily doped regions.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 2005-46361 filed on May 31, 2005, in the Korean Intellectual Property Office, and entitled: "Non-Volatile Memory Device and Method of Forming the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
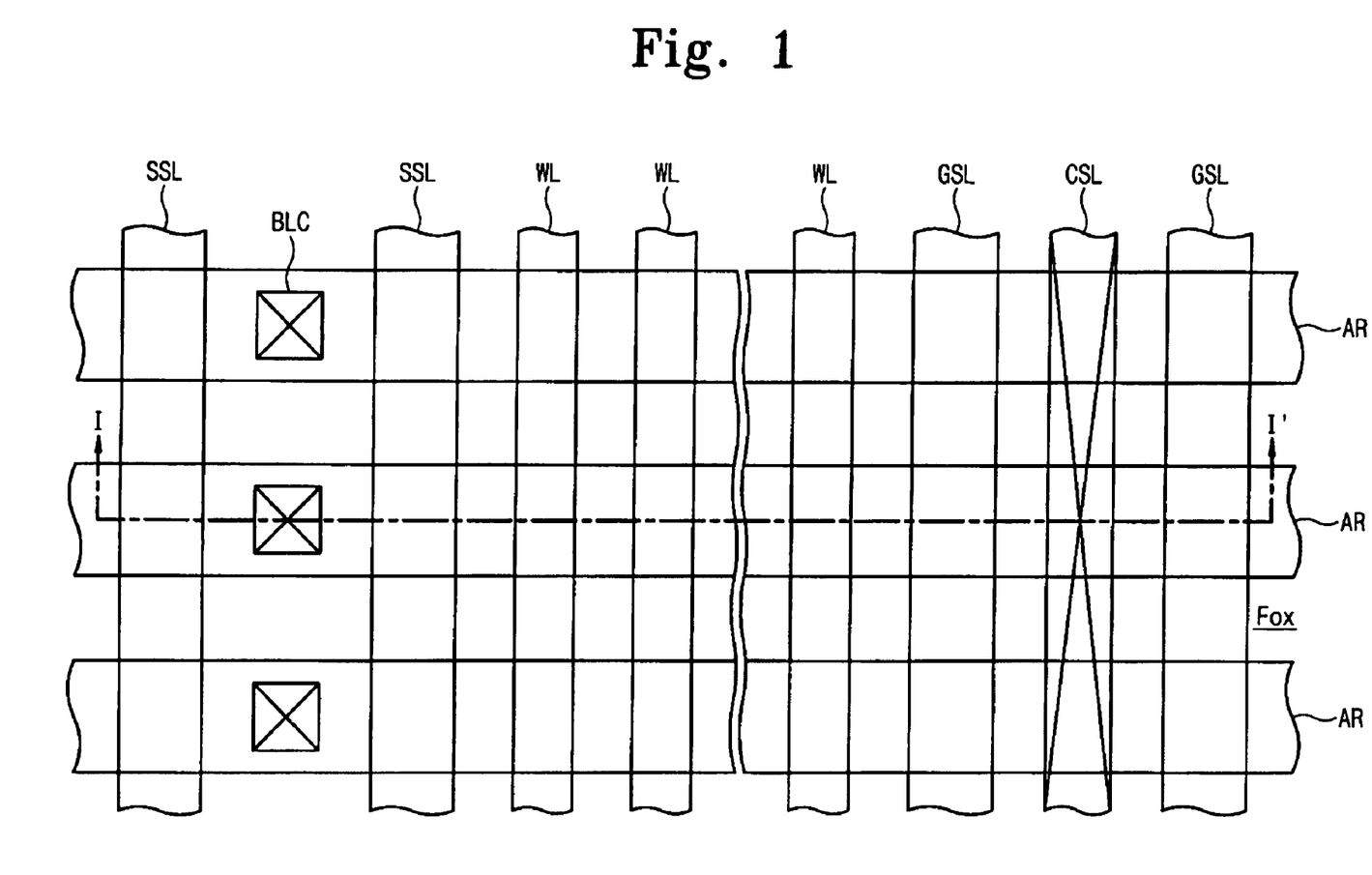
FIG. 1 illustrates a top-view of an exemplary NAND-type non-volatile memory device.

FIG. 1 illustrates a top-view of a cell array region of an exemplary NAND-type non-volatile memory device.

Figure 2:
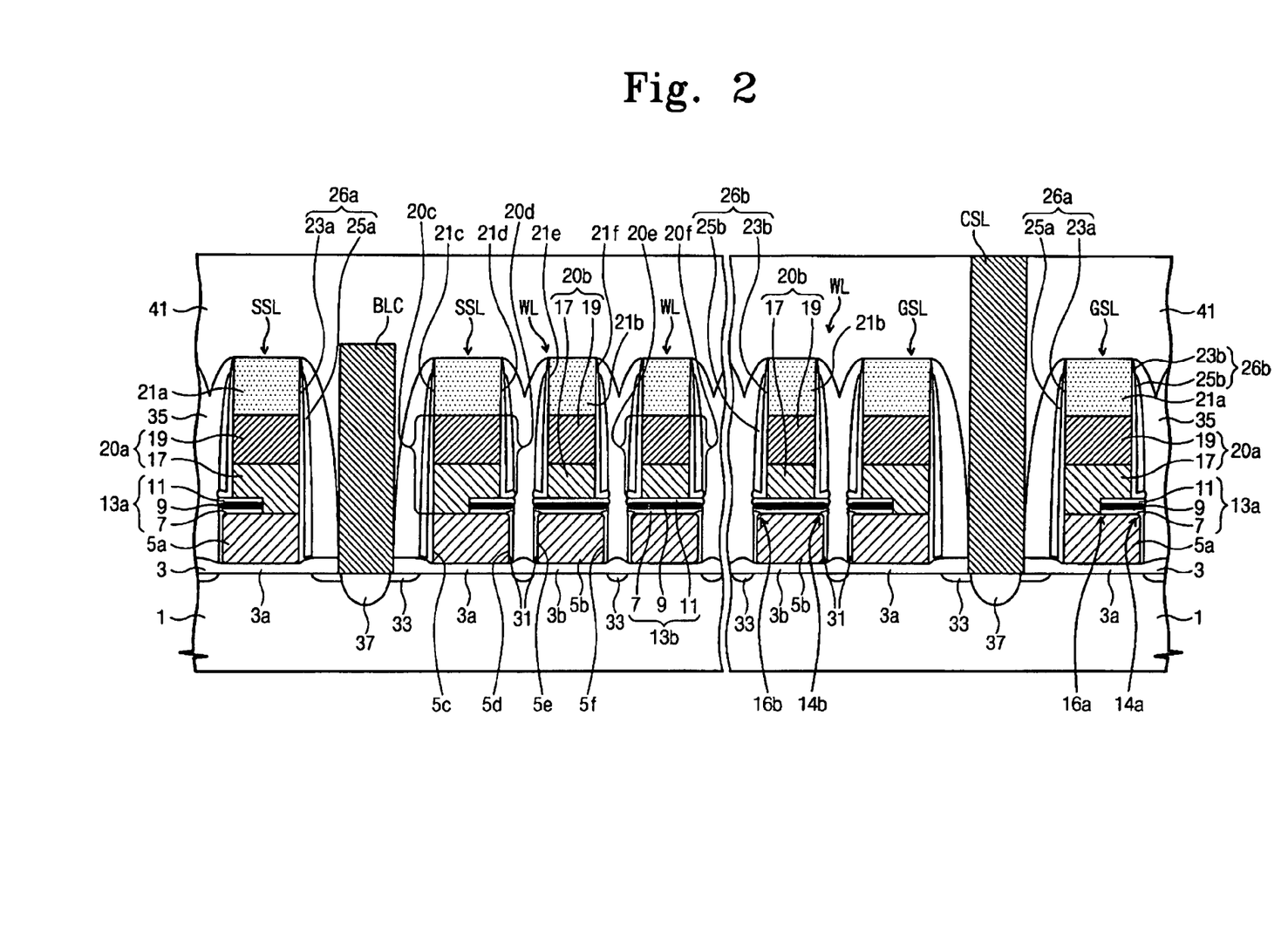
FIG. 2 illustrates a cross-sectional view along line I-I' of FIG. 1.

As shown in FIG. 1, in a cell array region on a semiconductor substrate, active regions AR may be defined by respective field oxide $F_{ox}$ portions formed on a semiconductor substrate 1 (shown in FIG. 2). String selection lines SSL and ground selection lines GSL may extend parallel with one another. A plurality of wordlines WL may be interposed between respective ones of the string selection lines SSL and the ground selection lines GSL. For example, as shown in FIG. 1, three or more word lines WL may be formed between one of the string selection lines SSL and one of the ground selection lines GSL. A string selection line SSL, a ground selection line GSL, and a plurality of wordlines WL interposed therebetween may cross over the active region AR, thereby constituting a cell string. Cell strings may be repeatedly and/or symmetrically arranged. A bitline contact BLC may be arranged in the active region AR between adjacent string selection lines SSL. A common source line CSL may extend between adjacent ground selection lines GSL.

FIG. 2 illustrates a cross-sectional view along line I-I' of FIG. 1.

As shown in FIG. 1 and FIG. 2, each of the selection lines SSL and the ground selection lines GSL may each include a first gate insulator 3a, a first floating gate 5a, a first intergate dielectric pattern 13a, a first control gate 20a and a first mask pattern 21a, which may be stacked on the semiconductor substrate 1 in the order named. The first intergate dielectric pattern 13a may have a smaller width, i.e., may extend a shorter distance along the line I-I' of FIG. 1, than the first floating gate 5a. A first side 14a of the first intergate dielectric pattern 13a may be substantially aligned with or may extend beyond a first side of the first floating gate 5a. The first side 14a of the first intergate dielectric patterns 13a may be exposed between corresponding portions of the first control gate 20a and the first floating gate 5a while a second side 16a of the first intergate dielectric pattern 13a, which is opposite to the first side 14a, may be encapsulated by one or both of the first control gate 20a and the first floating gate 5a. That is, the first floating gate 5a and the first control gate 20a may contact each other at the second side 16a of the first intergate dielectric pattern 13a. As a result of the contact between the first floating gate 5a and the first control gate 15a, when a voltage is applied to a string selection transistor to select a string, the floating gate 5a will not be programmed and a threshold voltage of the string selection transistor will not rise. As a result, a memory device may operate even at a relatively low voltage.

As shown in FIG. 2, the wordlines WL may each include a second gate insulator 3b, a second floating gate 5b, a second intergate dielectric pattern 13b, a second control gate 20b and a second mask pattern 21b, which may be stacked on the semiconductor substrate 1 in the order named. The second intergate dielectric pattern 13b of the wordlines WL may extend at least between overlapping portions of the second control gate 20b and the second floating gate 5b such that the second control gate 20b may not directly contact the second floating gate 5b. A width of the second control gate 20b and/or a width of the second mask pattern 21b, along the line I-I' of FIG. 1, may be less than a width of the second floating gate 5b, along the line I-I' of FIG. 1. The width of the second control gate 20b and/or a width of the second mask pattern 21b, along the line I-I' of FIG. 1, may be less than a width of the second intergate dielectric pattern 13b, along the line I-I' of FIG. 1.

The width of the second intergate dielectric pattern 13b may be substantially the same as the width of the second floating gate 5b. As shown in FIG. 2, the second intergate dielectric pattern 13b may include a first side 14b and a second side 16b, opposite to the first side 14b. The first and second sides 14b and 16b may both be exposed from between the second control gate 20b and the second floating gate 5b. The first and second sides 14b and 16b may have a shape corresponding to respective end portions of each layer of the second intergate dielectric layer 13b.

The first and second control gates 20a and 20b may include a polysilicon layer 17, which may be doped with, e.g., N-type-impurities, and a tungsten layer 19 having a low electrical resistance. The tungsten layer 19 may help enhance a speed of a memory device. The floating gates 5a and 5b may include a polysilicon layer that may be doped with, e.g., N-type impurities. The intergate dielectric patterns 13a and 13b may be a multi-layer structure. In embodiments of the invention, the intergate dielectric patterns 13a and 13b may be, e.g., triple layer structures that may include, e.g., a first silicon oxide layer 7, a first silicon nitride layer 9 and a second oxide layer 11.

As shown in FIG. 2, in embodiments of the invention, a first sidewall of the string selection lines SSL and a first sidewall of the ground selection lines GSL may each be defined by a combination of corresponding respective first sidewalls 21c, 20c and 5c of the first mask pattern 21a, the first control gate 20a and the first floating gate 5a. As shown in FIG. 2, the bit line contact BLC and/or the common source line CSL may be arranged between respective facing first sidewalls of the ground selection lines GSL and string selection lines SSL.

The first sidewall of the string selection line SSL and the first sidewall of the ground selection line GSL may be covered with a first barrier spacer 26a. The first barrier spacers 26a may include a medium-temperature oxide (MTO) layer 23a and a second silicon nitride layer 25a. The MTO layer 23a may be sandwiched between the first sidewall of the string selection line SSL and the second silicon nitride layer 25a of the respective first barrier spacer 26a. The first barrier spacers 26a may extend completely or substantially along a length of the first sidewall of the ground selection lines GSL or the string selection lines SSL. The second silicon nitride layer 25a may extend a shorter distance along the length direction than the respective MTO layer 23a, where the length direction is a direction perpendicular the direction of the I-I' line shown in FIG. 1 and may not extend completely along the length of the first sidewalls of the ground selection lines GSL or the string selection lines SSL.

A second sidewall of the string selection lines SSL and a second sidewall of the ground selection lines GSL may each be defined by a combination of the first side 14a of the first intergate dielectric pattern 13a and corresponding respective second sidewalls 21d, 20d and 5d of the first mask pattern 21a, the first control gate 20a and the first floating gate 5a.

The second sidewall of the string selection lines SSL and the second sidewall of the ground selection lines GSL may each include upper and lower portions with the first side 14a of the first intergate dielectric pattern 13a extending therebetween. The upper portion of each of the second sidewalls of the string selection lines SSL and the ground selection lines GSL may be defined by a combination of corresponding respective sidewalls 21d and 20d of the first mask pattern 21a and the first control gate 20a. The lower portion of each of the second sidewalls of the string selection lines SSL and the ground selection lines GSL may be defined by the second sidewall 5d of the first floating gate 5a. The lower portion of the second sidewalls of the string selection lines SSL and the lower portion of the second sidewalls of the ground selection lines GSL, e.g., the second sidewall 5d of the first floating gate 5a, may be covered with a thermal oxide layer 31. The first sidewall 5c of the first floating gate 5a may be opposite to the second sidewall 5d of the first floating gate 5a.

The upper portion of the second sidewall of the string selection lines SSL and the upper portion of the second sidewall of the ground selection lines GSL may be covered with a second barrier spacer 26b. The second barrier spacers 26b may be made of the same materials as the first barrier spacers 26a. The second barrier spacers 26b may include an MTO layer 23b and a second silicon nitride layer 25b. The MTO layer 23b may be sandwiched between the upper portion of the second sidewalls of the string selection lines SSL and the upper portion of the second sidewalls of the ground selection lines GSL, e.g., between the second sidewalls 20d and 21d of the first control gate 20a and the first mask pattern 21a, respectively, and the second silicon nitride layer 25b of the respective second barrier spacer 26b.

The second barrier spacers 26b may be formed above the first intergate pattern 13a and the second barrier spacer 26b may not cover the first side 14a of the first intergate pattern 13a and the second side 5d of the first floating gate 5a. The first side 14a of the first intergate pattern 13a may be exposed along with outer surfaces of the second barrier spacer 26b and the respective thermal oxide layer 31.

As shown in FIG. 2, the second sidewalls of the ground selection lines GSL and the second sidewalls of the string selection lines SSL may face respective sidewalls of the word lines WL. The first sidewalls of the ground selection lines GSL and the first sidewalls of the string selection lines SSL may be respectively opposite to the second sidewalls of the ground selection lines GSL and the second sidewalls of the string selection lines SSL.

Sidewalls of the wordlines WL may include upper and lower portions with the first or second sides 14b, 16b of the second intergate dielectric pattern 13b extending therebetween. The upper portion of each of the first sidewalls of the wordlines WL may be defined by a combination of corresponding respective sidewalls 21e and 20e of the second mask pattern 21b and the second control gate 20b. The upper portion of each of the second sidewalls of the wordlines WL may be defined by a combination of corresponding respective sidewalls 21f and 20f of the second mask pattern 21b and the second control gate 20b. The lower portion of each of the first sidewalls of the wordlines WL may be defined by a sidewall 5e of the second floating gate 5b and the lower portion of each of the second sidewalls of the wordlines WL may be defined by a sidewall 5f of the second floating gate 5b. The first sidewall 5e of the second floating gate 5b may be opposite to the second sidewall 5f of the second floating gate 5b.

Upper portions of first and second sidewalls of the wordlines WL may be covered with the second barrier spacers 26b and lower portions of the of the first and second sidewalls of the word lines WL may be covered with the thermal oxide layer 31. The second barrier spacers 26b may include a medium-temperature oxide (MTO) layer 23b and a second silicon nitride layer 25b. The first sidewalls of the wordlines WL may be opposite to the second sidewalls of the wordlines WL.

The second barrier spacers 26b may extend along an entire or substantially entire length of the upper portions of the second sidewalls of the string selection lines SSL, the upper portions of the second sidewalls of the ground selection lines GSL and/or the upper portions of the first and second sidewalls of the wordlines WL. The second silicon nitride layer 25b may extend a shorter distance along the length direction than the respective MTO layer 23b, where the length direction is a direction perpendicular the direction of the I-I' line shown in FIG. 1 and may not extend completely along the length of the upper portions of the second sidewalls of the string selection lines SSL, the upper portions of the second sidewalls of the ground selection lines GSL and/or the upper portions of the first and second sidewalls of the wordlines WL.

In embodiments of the invention, the first and second barrier spacers 26a and 26b may be formed of the same materials and may be formed during the same processing step(s). For example, the MTO layers 23a, 23b may be formed at the same time. In the exemplary embodiment shown in FIG. 2, the first and second barrier spacers 26a and 26b are two layer structures with the respective MTO layer 23a, 23b and the respective second silicon nitride layer 25a, 25b. However, the first and second barrier spacers 26a and 26b are not limited to such a structure. For example, in embodiments of the invention, each of the first and second barrier spacers 26a and 26b may be a triple layer structure including the respective MTO layer 23a, 23b, the respective second silicon nitride layer 25a, 25b and a respective silicon oxide layer (not shown).

In embodiments of the invention, the first and second barrier spacers 26a and 26b help reduce and/or prevent corrosion and/or oxidation of the first and second control gates 20a and 20b during processing of a memory device. For example, the first and second barrier spacers 26a and 26b help reduce and/or prevent corrosion of the tungsten layer 19 from a cleaning solution and also help reduce and/or prevent oxidation of the tungsten layer 19 during an oxidation process. The MTO layer 23a, 23b serves to reduce and/or prevent a stress that may be generated between the second silicon nitride layer 25a, 25b and the respective polysilicon layer 17. The second silicon nitride layer 25a, 25b helps reduce and/or prevent penetration of oxygen and a cleaning solution to the MTO layer 23a, 23b and the respective first and second control gates 20a and 20b.

As shown in FIG. 2, boundaries and ends of at least some of the layers of the wordlines WL, the string selection lines SSL and the ground selection lines GSL may be curved or rounded. In embodiments of the invention, end portions of at least one of the layers of the wordlines WL, the string selection lines SSL and the ground selection lines GSL may have a shape similar to that of a bird's beak. For example, end portions of the each of the first silicon oxide layer 7, the first silicon nitride layer 9 and the second oxide layer 11 may be rounded.

In the exemplary embodiment shown in FIG. 2, the first sidewall 14b and the second sidewalls 16b of the second intergate patterns 13b of the wordlines WL and the first sidewalls 14a of first intergate patterns 13a of the ground selection lines GSL and the string selection lines SSL are similar. Thus, in the following description, unless noted otherwise, the description of the first sidewalls 14a of the first intergate patterns 13a may also apply to the first and second sidewalls 14b, 16b of the second intergate patterns 13b.

As shown in FIG. 2, on the first side 14a of the first intergate pattern 13a, at least an end portion of a boundary between the first silicon oxide layer 7 and the first silicon nitride layer 9 may be curved. At least an end portion of a boundary between the second oxide layer 11 and the first silicon nitride layer 9 may be curved. At least an end portion of a boundary between the first floating gate 5b and the first gate insulator 3a may be curved. At least an end portion of a boundary between the second floating gate 5b and the second gate insulator 3b may be curved.

A lightly doped drain (LDD) region 33 may be formed in the active region AR of the semiconductor substrate 1 adjacent to and between, e.g., adjacent ones of the wordlines WL, the string selection lines SSL, the ground selection lines GSL and/or the common source lines CSL. Spacers 35 may be formed between adjacent ones of the wordlines WL, the string selection lines SSL, the ground selection lines GSL and/or the common source lines CSL.

Sidewalls of the string selection lines SSL, the ground selection lines GSL and the wordlines WL may be covered with spacers 35. The spacers 35 may cover the first barrier spacers 26a, the second barrier spacers 26b, the first side 14a of the first intergate dielectric layer 13a and/or the thermal oxide layers 31 covering the sidewalls of the string selection lines SSL, the ground selection lines GSL and the wordlines WL. The spacers 35 may be string-like structures filling the relatively narrow spaces between the string selection lines SSL, the ground selection lines GSL, the wordlines WL, the common source lines CSL and/or the bit line contacts BSL.

Between adjacent ones of the string selection lines SSL and the ground selection lines GSL, heavily doped regions 37 may be formed, adjacent to the respective spacers 35, in an active region AR of the semiconductor substrate 1.

As shown in FIG. 2, an interlayer dielectric 41 may cover the string selection lines SSL, the wordlines WL and the ground selection lines GSL. The common source line(s) CSL may penetrate through the interlayer dielectric layer 41 and may contact the heavily doped region 37 through the interlayer dielectric 41 between, e.g., adjacent ones of the ground selection lines GSL. The bitline contact(s) BLC may contact a respective heavily doped region 37 on, e.g., a bottom side thereof and may penetrate through the interlayer dielectric layer 41. The bitline contact(s) BLC may extend between, e.g., adjacent ones of the string selection lines SSL. The heavily doped regions 37 serve to reduce contact resistance between the common source line(s) CSL and the semiconductor substrate 1, and between the bitline contact(s) BLC and the semiconductor substrate 1.

According to exemplary embodiment of the non-volatile memory device described with reference to FIG. 2, the tungsten layer 19 may be protected from an oxidative cleaning solution, e.g., SC1, and oxygen by the barrier spacers 26a and 26b and thus, speed and reliability of the memory device may be improved.

A method of forming the non-volatile memory device illustrated in FIG. 2 will be described below with reference to FIGS. 3 to 12.

Figure 3:
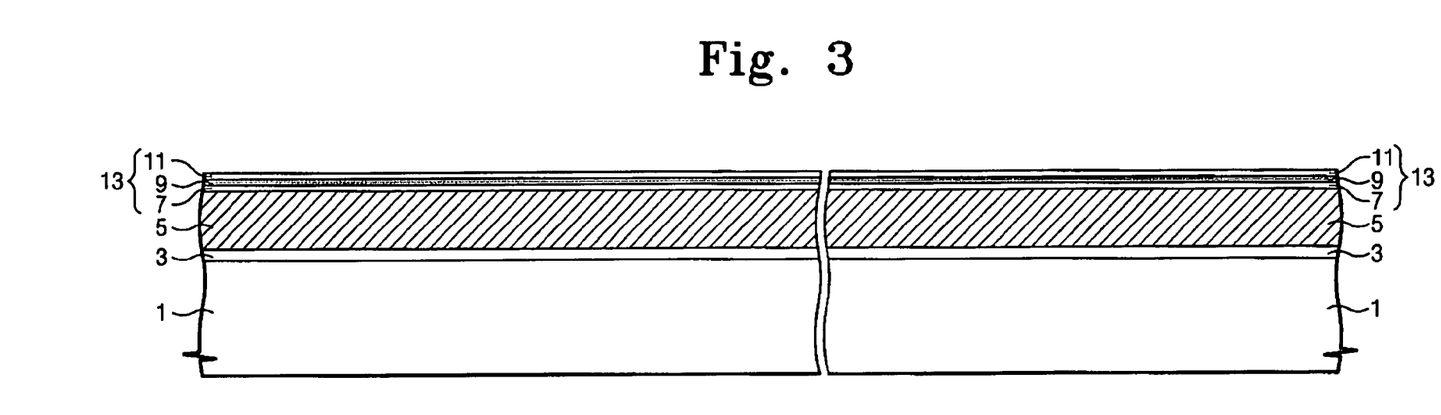
FIGS. 3 through 12 illustrate cross-sectional views of stages in a method of forming the non-volatile memory device illustrated in FIG. 2.

As shown in FIG. 3, a gate insulator layer 3 may be formed on the semiconductor substrate 1. The gate insulator layer 3 may be formed using, e.g., thermal oxidation, etc. Although not shown in FIG. 3, the field oxide $F_{ox}$ (shown in FIG. 1) may be formed on the semiconductor substrate 1 before the gate insulator layer 3 is formed. The field oxide $F_{ox}$ may be formed using, e.g., shallow trench isolation (STI) or self-alignment with polysilicon forming a floating gate. A floating gate layer 5 and an intergate dielectric layer 13 may be sequentially formed on the semiconductor substrate 1, where the gate insulator layer 3 is formed. The floating gate layer 5 may be made of, e.g., polysilicon that may be doped with, e.g., N-type impurities, e.g., phosphorus (P). The intergate dielectric 13 may be formed by sequentially depositing a first silicon layer 7, a first silicon nitride layer 9 and a second silicon oxide layer 11.

Figure 4:
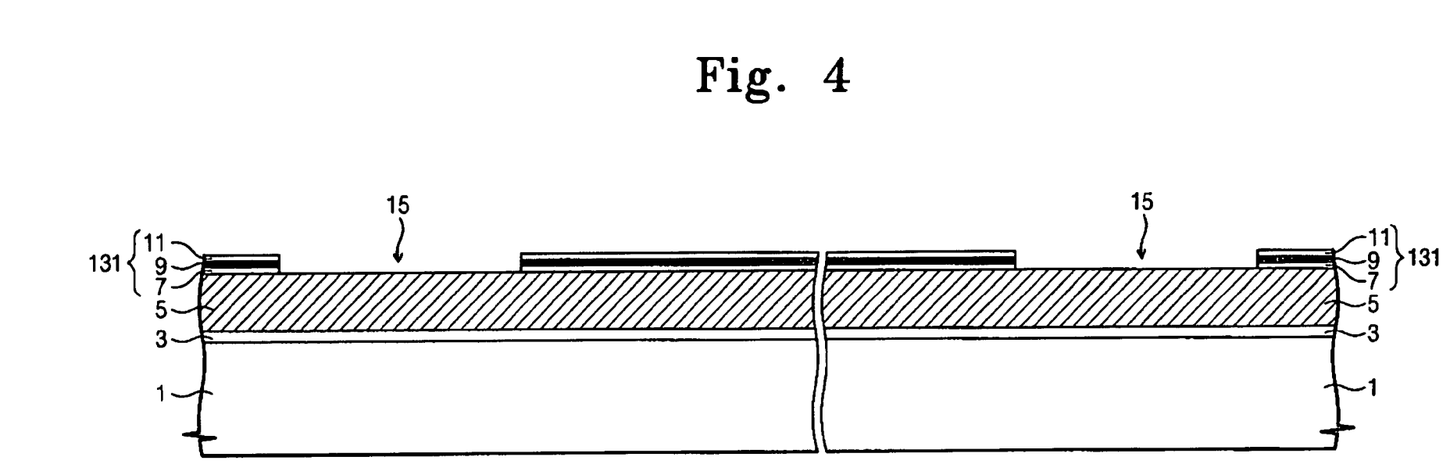

As shown in FIG. 4, the intergate dielectric 13 may be patterned to form a temporary intergate dielectric pattern 131 with openings 15 exposing a top surface of the floating gate layer 5. The openings 15 may be formed at portions substantially corresponding to spaces between adjacent ones of the string selection lines SSL and adjacent ones of the ground selection lines GSL. A width of the floating gate pattern 51, which may correspond to a distance between adjacent ones of the openings 15 may substantially correspond to a distance, along the direction of line I-I' of FIG. 1, between outer sidewall portions of a string selection line SSL and a ground selection line GSL of a completed cell string. The temporary intergate dielectric pattern 131 may have a smaller width, along the direction of the line I-I' of FIG. 1, than the floating gate pattern 51.

Figure 5:
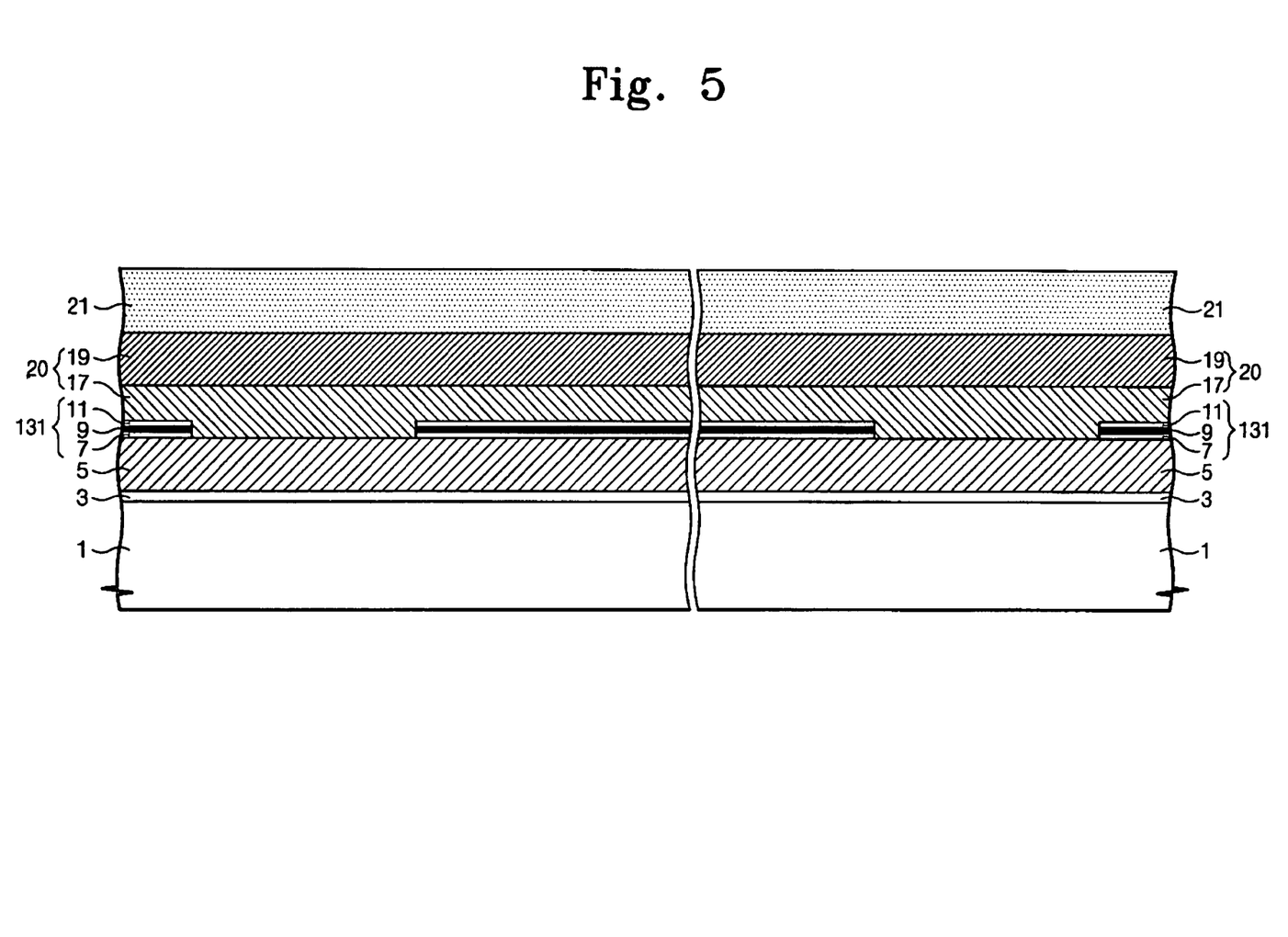

As shown in FIG. 5, a control gate layer 20 and a mask layer 21 may be sequentially formed on a surface of the semiconductor substrate 1. The control gate layer 20 and the mask layer 21 may be sequentially formed so as to entirely cover the surface of the semiconductor substrate 1. The control gate 20 may be formed by, e.g., sequentially forming, e.g., a polysilicon layer 17 doped with, e.g., N-type impurities, e.g., phosphorous (P), and a tungsten layer 19.

Figure 6:
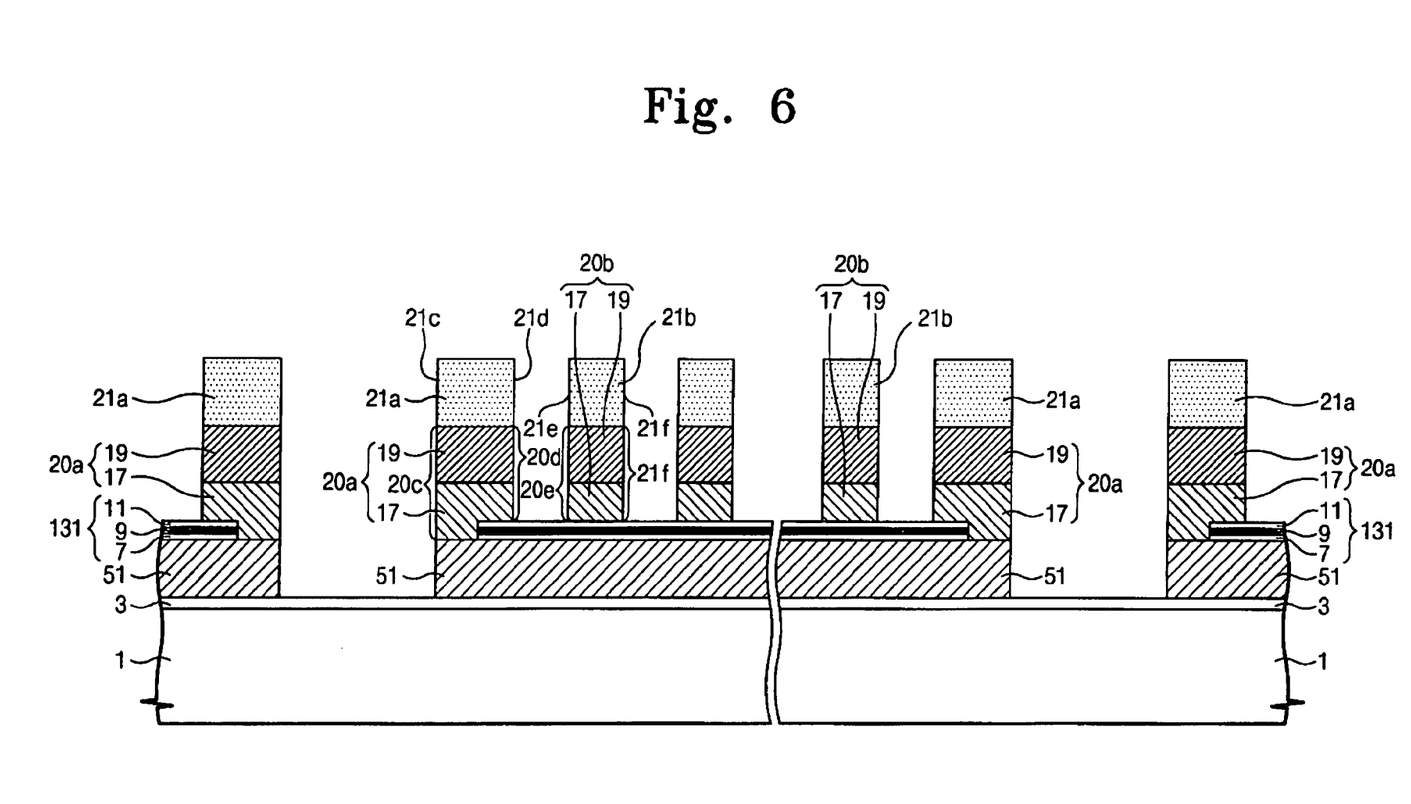

A photoresist pattern (not shown) may then be used to pattern the mask layer 21 to form a first mask pattern 21a and a second mask pattern 21b, as shown in FIG. 6. The first mask pattern 21a may be used to define selection lines, e.g., string selection lines SSL and ground selection lines GSL. The second mask pattern 21b may be used to define wordlines WL. Using the photoresist pattern and the first and second mask patterns 21a and 21b, as etch masks, the control gate layer 20 and the floating gate layer 5, which is exposed by the opening 15, may be partially patterned to expose the temporary intergate dielectric pattern 131 and the gate insulator 3.

An etch process may be performed and the etch process may involve sequentially supplying a gas for etching the tungsten layer 19, e.g., $CF_4$, and a gas for etching the polysilicon layer 17, e.g., $SF_6$. The first control gate 20a, the second control gate 20b and a floating gate pattern 51 may be formed as a result of the etch process. The floating gate pattern(s) 51 may have the same width as one cell string, e.g., a combination of a string selection line SSL, a ground selection line GSL and a plurality of wordlines WL interposed between the string selection line SSL and the ground selection lines GSL and crossing over an active region AR. After completion of the etch process, a cleaning process may be performed to remove etch byproducts. The cleaning process may use a non-oxidative cleaning solution that will not corrode the tungsten layer 19. The non-oxidative cleaning solution may be, e.g., a weak acidic mixture of, e.g., ammonium hydroxide, hydrofluoric acid (HF) and acetic acid.

As shown in FIG. 6, the mask layer 21 may be patterned to form the first mask pattern(s) 21a, which overlaps a portion of the first control gate 20a that is formed on a portion of the temporary intergate dielectric pattern 131 and a portion of the first control gate 20a that is formed on a portion of the floating gate pattern 51, and the second mask pattern(s) 21b, which overlaps a portion of the second control gate 20b that overlaps a portion of the temporary intergate dielectric pattern 131 and the second control gate 20b does not contact the floating gate pattern 51.

Figure 7:
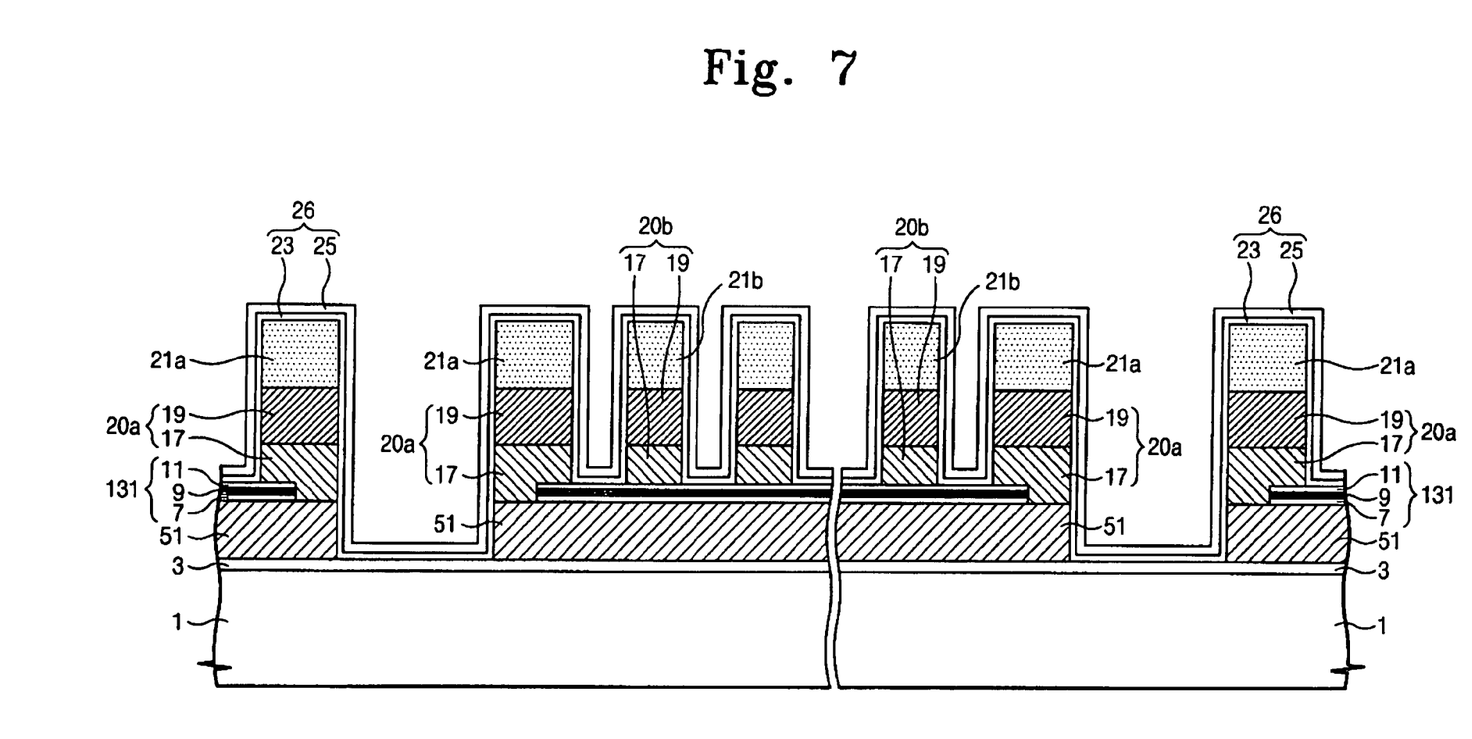

As shown in FIG. 7, an MTO layer 23 and a second silicon nitride layer 25 may be sequentially stacked on the semiconductor substrate 1 to form a barrier spacer layer 26. The second silicon nitride layer 25 may have a shape that substantially corresponds to the shape of the MTO layer 23. The MTO layer 23 and the second silicon nitride layer 25 may be formed using, e.g., chemical vapor deposition (CVD) or atomic layer deposition (ALD).

Figure 8:
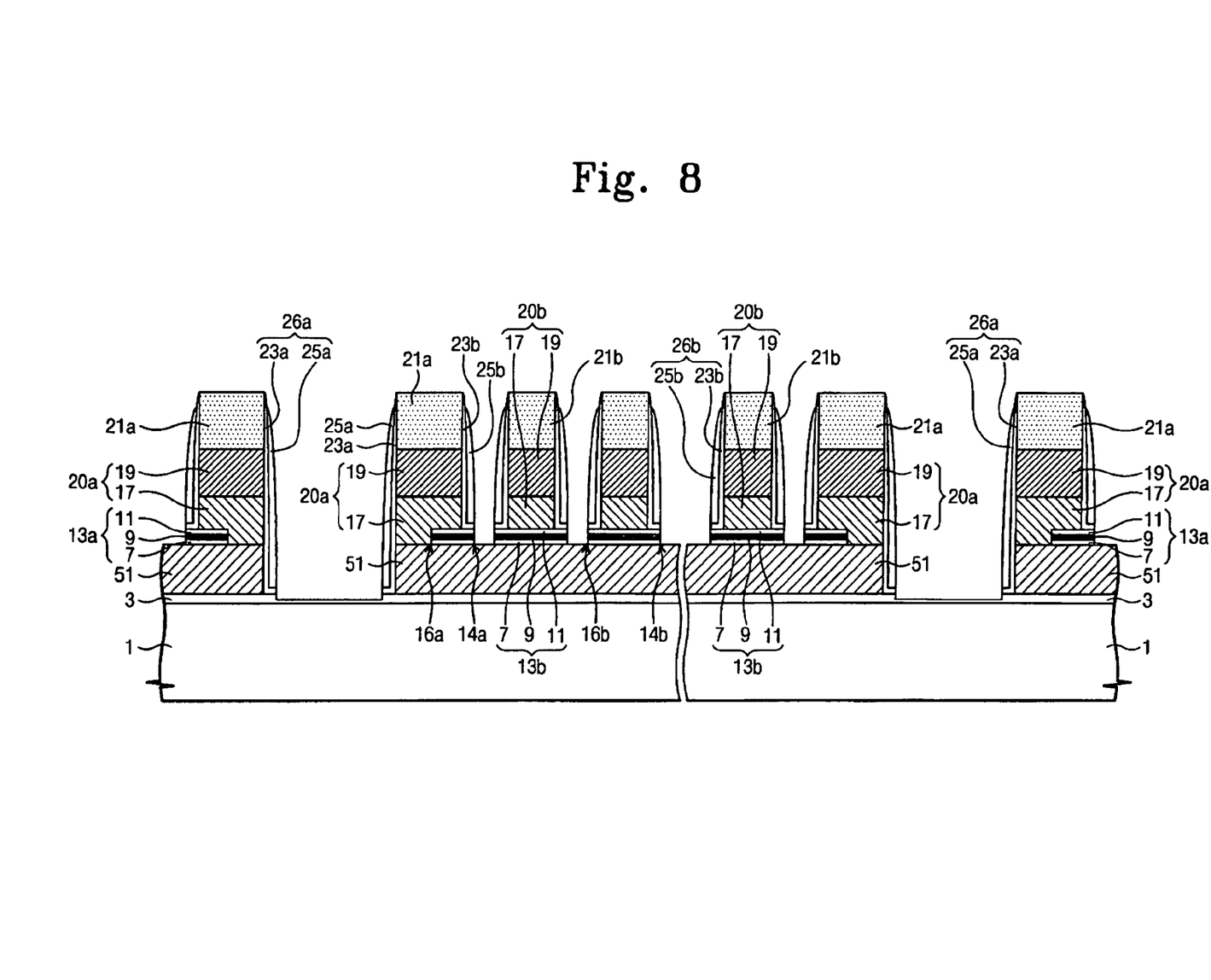

The barrier spacer layer 26 may then be anisotropically etched to form barrier spacers 26a and 26b that, as shown in FIG. 8, may cover sidewalls the mask patterns 21a and 21b, the control gates 20a and 20b and the floating gate pattern 51 while exposing a top surface of the temporary intergate dielectric pattern 131. The anisotropic etch process may be performed using an etch recipe having, e.g., an etch selectivity of silicon oxide to silicon nitride is 1:1. The anisotropic etch process may also pattern the exposed temporary intergate dielectric pattern 131 and may expose a top surface of the floating gate pattern 51 to simultaneously form the intergate dielectric patterns 13a and 13b.

A top surface of the gate insulator layer 3 may then be partially etched to form barrier spacers 26a and 26b. Each of the first barrier spacers 26a may cover a combination of a first sidewall 21c of the first mask pattern 21a, the first sidewall 20c of the first control gate 20a and the corresponding sidewall of the corresponding floating gate pattern 51. Each of the second barrier spacers 26b may cover upper portions of the sidewalls of the ground selection lines GSL, sidewalls of the signal selection lines SSL and sidewalls of the wordlines WL that are at least partially defined by the one of the first or second intergate dielectric layers 13a, 13b. For example, each of the second barrier spacers 26b may cover a combination of the second sidewall 21d of the first mask pattern 21a and the second sidewall 20d of the first control gate 20d, a combination of the first sidewall 21e of the second mask pattern 21b and the first sidewall 20e of the second control gate 20b, or a combination of the second sidewall 21f of the second mask pattern 21b and the second sidewall 20f of the second control gate 20b.

As shown in FIG. 8, the MTO layers 23a, 23b of the barrier spacers 26a and 26b may be formed into an L-shaped layer as a result of the anisotropic etch process. In embodiments of the invention, first legs of the L-shaped MTO layers 23a, 23b associated with the respective second barrier spacers 26b may be extend on opposing upper-end-surface portions of the second intergate dielectric layer 13b and an exposed-upper-end portion of the first intergate dielectric layer 13a, while second legs of the L-shaped MTO layers 23a, 23b extend substantially perpendicularly to a plane along which that semiconductor substrate 1 extends.

Figure 9:
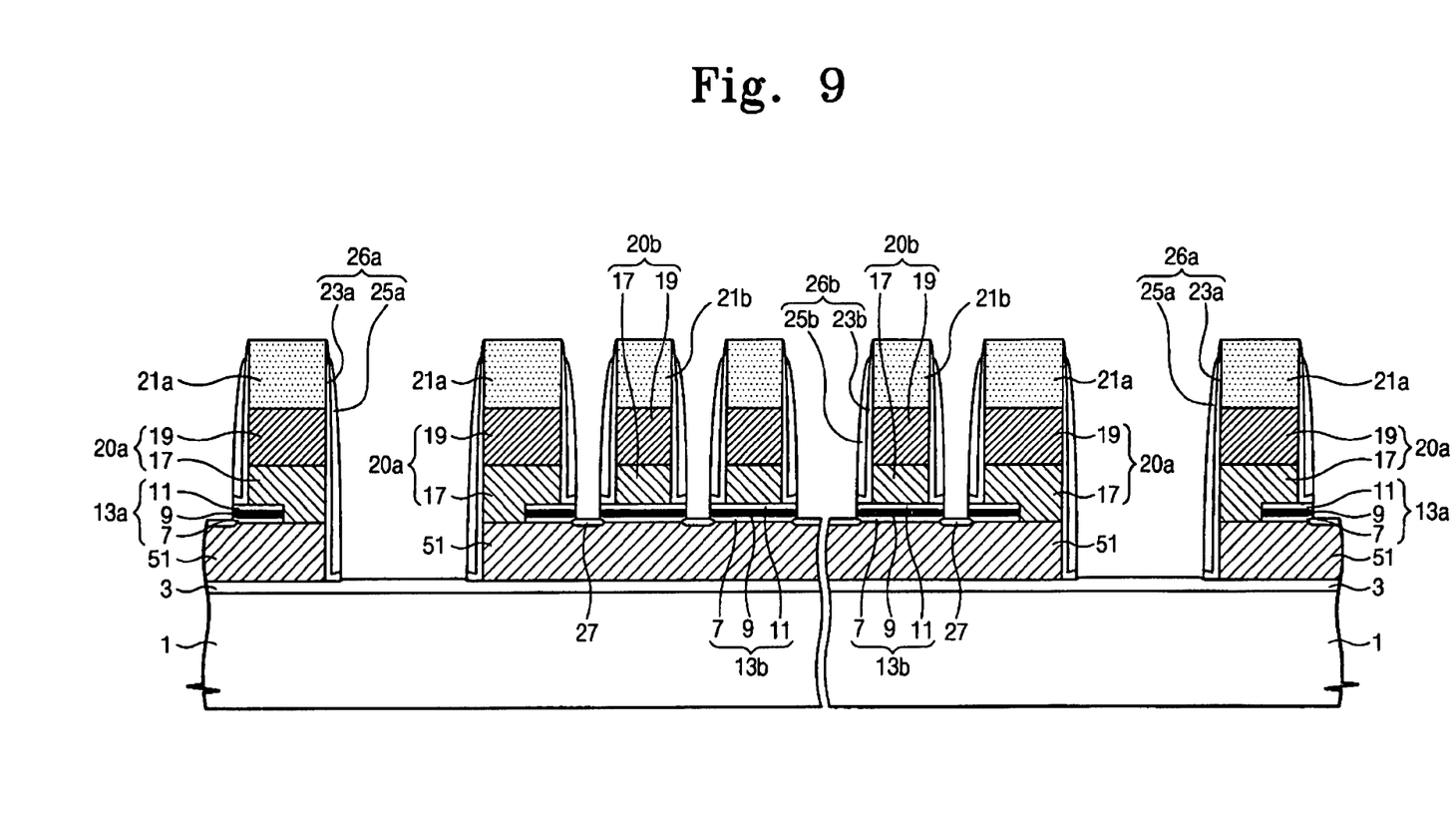

A first oxidation process may then be conducted to cure the etch damage, e.g., etch damage that may have occurred during the anisotropic etch process, of the intergate dielectric patterns 13a and 13b. As shown in FIG. 9, as a result of the first oxidation process, a silicon oxide layer 27 may be formed on a top surface of the exposed floating gate pattern 51 and, during the first oxidation process, the exposed gate insulator layer 3 may thicken. The first oxidation process may be, e.g., a high-temperature thermal oxidation process or an in-situ steam generation (ISSG) process. In cases where the first oxidation process is an ISSG process, a silicon oxide layer may be formed on surfaces of the second silicon nitride layer 25 and the first and second mask patterns 21a and 21b due to a strong oxidizing power of free radicals. A boundary between the first oxide layer 7 and the first silicon nitride layer 9 and a boundary between the second oxide layer 11 and the first silicon nitride layer 9 may be rounded or curved and may have a shape similar to that of a bird's beak.

Figure 10:
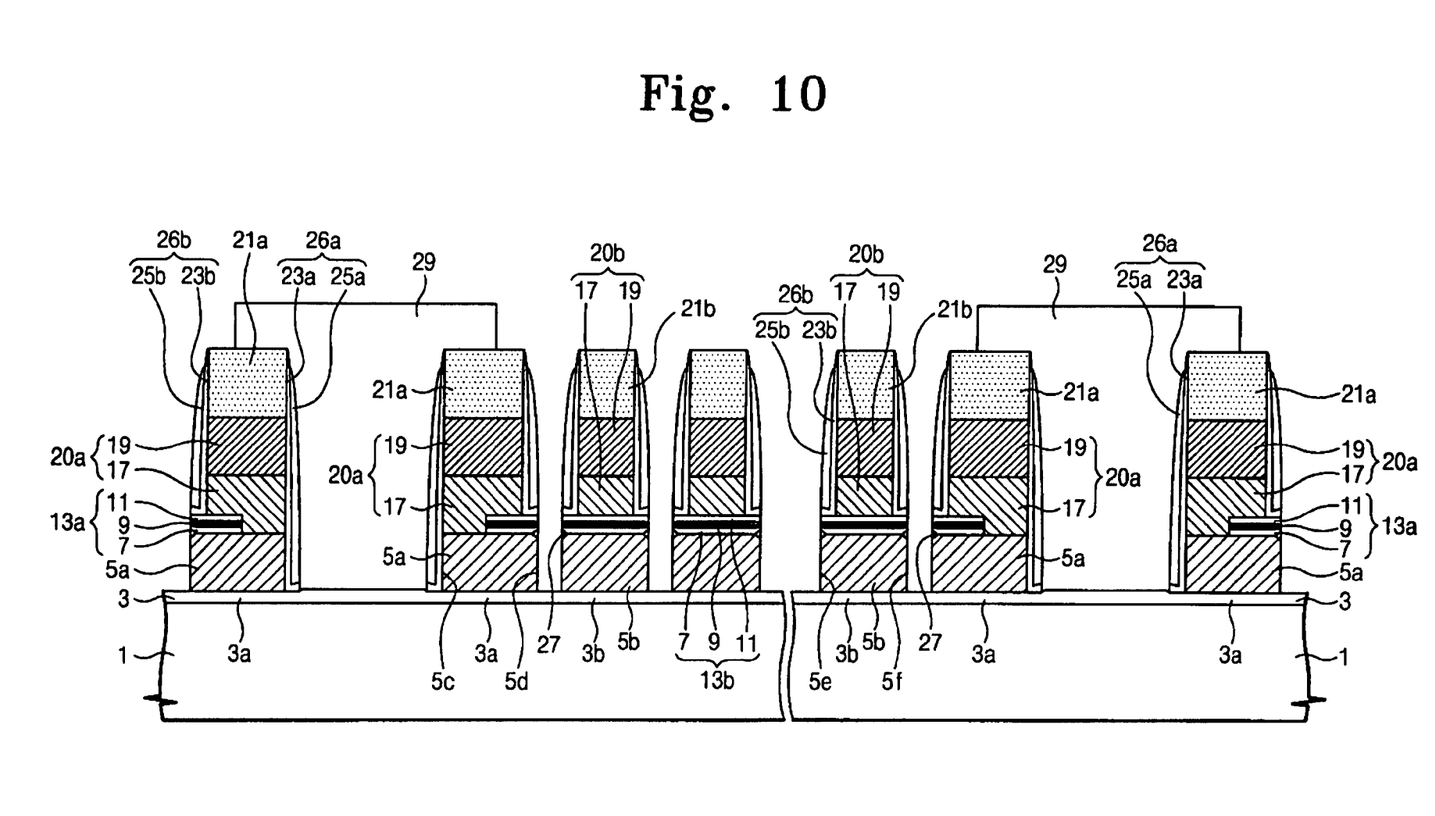

As shown in FIG. 10, a photoresist pattern 29 may be formed to cover the gate insulator layer 3 exposed to spaces between strings, e.g., between adjacent ground selection lines GSL and between string selection lines SSL, on the semiconductor substrate 1, while exposing the silicon nitride layer 27 formed on the floating gate pattern 51. Using the photoresist pattern 29, the first and second mask patterns 21a and 21b and the first and second barrier spacers 26a and 26b as etch masks, the exposed silicon oxide layer 27 and the underlying floating gate pattern 51 may be successively etched to expose the gate insulator layer 3 and to simultaneously form a first floating gate 5a and a second floating gate 5b below the first control gate 20a and the second control gate 20b, respectively. Hereinafter, the remaining gate insulator 3 below the first floating gate 5a will be referred to as "a first gate insulator 3a" and the remaining gate insulator 3 below the second floating gate 5b will be referred to as "a second gate insulator 3b".

Figure 11:
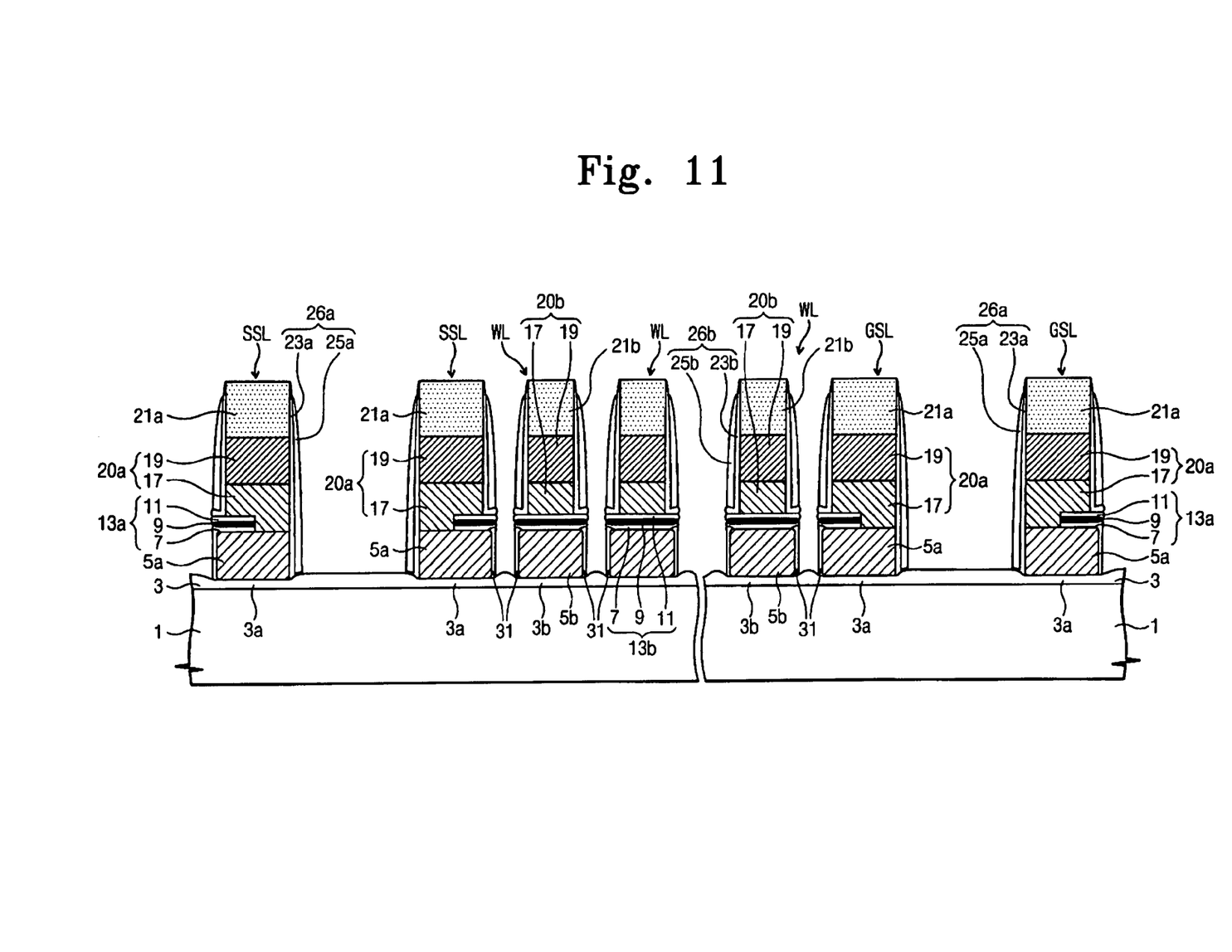

As shown in FIG. 11, the photoresist pattern 29 may then be removed. A cleaning process may be conducted using, e.g., an oxidative cleaning solution that may have a relatively a strong cleaning power. The oxidative cleaning solution may be, e.g., SC1 mixture of ammonium hydroxide, hydrogen peroxide and DI water. By means of the cleaning process, etch byproducts remaining on the semiconductor substrate 1 and sidewalls of the floating gates 5a and 5b may be removed.

A second oxidation process may then be conducted for the semiconductor substrate 1. The second oxidation process may be a conventional gate reoxidation process. For example, the second oxidation process may be a thermal oxidation process or an ISSG process. By means of the second oxidation process, a thermal oxide layer 31 may be formed on a sidewall of the first floating gate 5a, on opposite sidewalls of the second floating gate 5b, and the exposed portion of the gate insulator layer 3, between the floating gates 5a and 5b, may thicken.

In a case where the second oxidation process is an ISSG process, a silicon oxide layer may be formed on surfaces of the barrier spacers 26a and 26b and surfaces of the first and second mask patterns 21a and 21b. Due to the second oxidation process, the etch damage of the sidewalls of the floating gates 5a and 5b and the gate insulators 3a and 3b may be cured. Exposed ends of the MTO layer 23 and ends of the oxide layers 7 and 11 may also be oxidized and may thicken. As a result of the second oxidation process, ends of the boundary, e.g., between the first floating gate 5a and the first gate insulator 3a and the end of the boundary between the second floating gate 5b and the second gate insulator 3b may be rounded or curved and may have a shape similar to that of a bird's beak.

Figure 12:
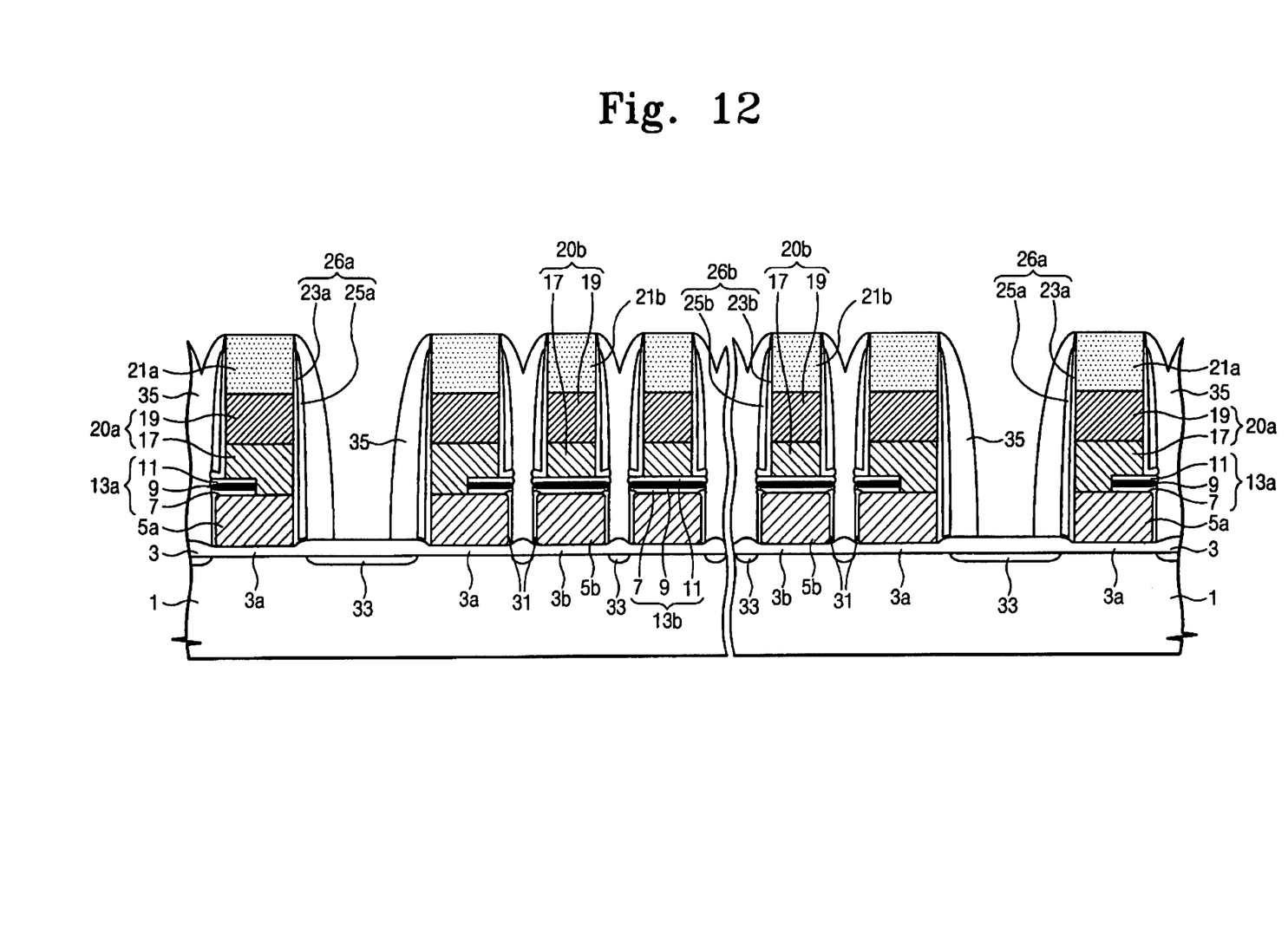

Referring to FIG. 12, the first and second mask patterns 20a and 20b may be used as ion implanting masks and an ion implanting process may be performed to form LDD regions 33 in the semiconductor substrate 1. Spacer layers may be stacked on the semiconductor substrate 1 and may be anisotropically etched to form spacers 35 between, e.g., the signal selection lines SSL, the ground selection lines GSL and the wordlines WL. The spacers 35 may fill spaces between the lines string selection lines SSL, the gate selection lines GSL and the word selection lines WL and may constitute stringlike structures because the spaces are very narrow.

The spacers 35 and the mask patterns 21a and 21b may then be used as ion implanting masks and an ion implanting process may be conducted to form heavily doped regions 37 in the semiconductor substrate 1 between the selection lines, as shown in FIG. 2. An interlayer dielectric 41 may be formed and patterned to form the bitline contact BLC and the common source line CSL between, e.g., adjacent ones of the string selection lines SSL and adjacent ones of the ground selection lines GSL, as shown in FIG. 2. The bitline contact BLC and the common source lines CSL may each be made of conductive materials.

In embodiments of the invention, barrier spacer layer(s) are provided to protect, e.g., a control gate layer, which may include a metal layer, from a cleaning solution and/or oxygen. Thus, a cleaning process may be conducted using a cleaning solution that has a strong cleaning power to effectively remove etch byproducts. In embodiments of the invention, an oxidation process may be conducted to cure etch damage that may have occurred on, e.g., the intergate dielectric pattern, the floating gate and the gate insulator layer. Embodiments of the invention provide more reliable non-volatile memory devices with enhanced speed.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A non-volatile memory device, comprising:
    field oxides disposed in a semiconductor substrate to define active regions;
    a string selection line crossing over the active regions;
    a ground selection line crossing over the active regions;
    a plurality of wordlines crossing over the active regions;

each of the string selection line and the ground selection line including:
- a first gate insulator on one of the active regions,
- a first floating gate, the first floating gate being on the first gate insulator and including a first sidewall and a second sidewall,
- a first intergate dielectric pattern on the first floating gate,
- a first control gate on the first intergate dielectric pattern and on the first floating gate and being in contact with the first floating gate and the first intergate dielectric pattern, and
- a first mask pattern on the first control gate;

each of the wordlines including:
- a second gate insulator on one of the active regions,
- a second floating gate, the second floating gate being on the second gate insulator and including a first sidewall and a second sidewall,
- a second intergate dielectric pattern on the second floating gate,
- a second control gate on the second intergate dielectric pattern, and
- a second mask pattern on the second control gate;

a thermal oxide layer covering the first sidewall and the second sidewall of the second floating gate and the second sidewall of the first floating gate;

first barrier spacers, wherein:
- each of the first barrier spacers covers a combination of a first sidewall of the first mask patterns, a first sidewall of the first control gates and the first sidewall of the first floating gates defining a same side of the respective string or ground selection line,
- each of the first barrier spacers includes an oxide layer and a nitride layer, the oxide layer being between the nitride layer and the first sidewall of the corresponding first control gate, and
- the first barrier spacers expose the second sidewall of the first floating gate, the exposed second sidewall of the first floating gate being covered by the thermal oxide layer; and second barrier spacers, wherein:
- each of the second barrier spacers covers at least one of a combination of a second sidewall of the first mask pattern and a second sidewall of the first control gate, a combination of a first sidewall of the second mask pattern and a first sidewall of the second control gate, and a combination of a second sidewall of the second mask pattern and a second sidewall of the second control gate,
- each of the second barrier spacers includes an oxide layer and a nitride layer, the oxide layer being between the nitride layer and the sidewall of the corresponding second control gate, and
- the second barrier spacers expose the first and second sidewalls of the second floating gate, the exposed first and second sidewalls of the second floating gate being covered by the thermal oxide layer, wherein the oxide layer of the first and second barrier spacers is a substantially L-shaped layer.

2. The non-volatile memory device as claimed in claim 1, wherein each of the first and second intergate dielectric patterns comprises a first oxide layer, a nitride layer and a second oxide layer, which are sequentially stacked.

3. The non-volatile memory device as claimed in claim 2, wherein at least one end of at least one of a boundary between the first oxide layer and the nitride layer, a boundary between the second oxide layer and the nitride layer, a boundary between the first floating gate and the first gate insulator, and a boundary between the second floating gate and the second gate insulator is curved.

4. The non-volatile memory device as claimed in claim 1, wherein the first control gates and the second control gates each include a metal layer.

5. The non-volatile memory device as claimed in claim 4, wherein the metal layer includes tungsten.

6. The non-volatile memory device as claimed in claim 4, wherein:
- the first floating gates and the second floating gates each include polysilicon doped with N-type impurities, and
- the first control gates and the second control gates further include a polysilicon layer doped with N-type impurities, the polysilicon layer being arranged below the metal layer.

7. The non-volatile memory device as claimed in claim 1, further comprising:
- spacers covering the first barrier spacers and the second barrier spacers;
- lightly doped regions in the semiconductor substrate below the spacers;
- heavily doped regions in the semiconductor substrate adjacent to the spacers and between the respective ones of the ground selection lines and the string selection lines;
- an interlayer dielectric covering the string selection lines, the ground selection lines and the wordlines;
- a common source line arranged between adjacent ones of the ground selection lines and contacting one of the heavily doped regions through the interlayer dielectric; and
- a bitline contact arranged between adjacent ones of the string selection lines and contacting another one of the heavily doped regions through the interlayer dielectric.

* * * * *